United States Patent
Rumbaugh

(10) Patent No.: US 7,504,823 B2
(45) Date of Patent: Mar. 17, 2009

(54) THERMAL OPTICAL CHUCK

(75) Inventor: Scott Rumbaugh, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 85 days.

(21) Appl. No.: 11/607,331

(22) Filed: Dec. 1, 2006

(65) Prior Publication Data

US 2007/0075724 A1    Apr. 5, 2007

Related U.S. Application Data

(63) Continuation of application No. 11/123,687, filed on May 6, 2005, now Pat. No. 7,176,705.

(60) Provisional application No. 60/577,752, filed on Jun. 7, 2004.

(51) Int. Cl.
G01R 31/28 (2006.01)

(52) U.S. Cl. ................................... 324/158.1

(58) Field of Classification Search .................. 324/754, 324/761–762, 765, 760, 757–758, 752–753; 356/479, 497, 239.1
See application file for complete search history.

(56) References Cited

U.S. PATENT DOCUMENTS

| | | |
|---|---|---|
| 1,191,486 A | 7/1916 | Tyler |
| 1,337,866 A | 4/1920 | Whitacker |
| 2,142,625 A | 1/1939 | Zoethout |
| 2,197,081 A | 4/1940 | Piron |
| 2,264,685 A | 12/1941 | Wells |
| 2,376,101 A | 5/1945 | Tyzzer |
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |

(Continued)

FOREIGN PATENT DOCUMENTS

CN    1083975    3/1994

(Continued)

OTHER PUBLICATIONS

Mark S. Boguski and Martin W. McIntosh, "Biomedical informatics for proteomics," insight: review article, Nature 422, 233-237 (2003); doi:10.1038/nature01515.

(Continued)

*Primary Examiner*—Ha Tran T Nguyen
*Assistant Examiner*—Tung X Nguyen
(74) *Attorney, Agent, or Firm*—Chernoff, Vilhauer, McClung & Stenzel

(57) ABSTRACT

An accessible optical path to a lower surface of a heatable device under test is provided by a thermal optical chuck comprising a transparent resistor deposited on transparent plate arranged to supporting the device in a probe station.

21 Claims, 3 Drawing Sheets

U.S. PATENT DOCUMENTS

| | | |
|---|---|---|
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |

| | | | | | |
|---|---|---|---|---|---|
| 4,787,752 A | 11/1988 | Fraser et al. | 5,101,149 A | 3/1992 | Adams et al. |
| 4,791,363 A | 12/1988 | Logan | 5,101,453 A | 3/1992 | Rumbaugh |
| 4,795,962 A | 1/1989 | Yanagawa et al. | 5,103,169 A | 4/1992 | Heaton et al. |
| 4,805,627 A | 2/1989 | Klingenbeck et al. | 5,105,148 A | 4/1992 | Lee |
| 4,810,981 A | 3/1989 | Herstein | 5,105,181 A | 4/1992 | Ross |
| 4,812,754 A | 3/1989 | Tracy et al. | 5,107,076 A | 4/1992 | Bullock et al. |
| 4,816,767 A | 3/1989 | Cannon et al. | 5,136,237 A | 8/1992 | Smith et al. |
| 4,818,169 A | 4/1989 | Schram et al. | 5,142,224 A | 8/1992 | Smith et al. |
| 4,827,211 A | 5/1989 | Strid et al. | 5,144,228 A | 9/1992 | Sorna et al. |
| 4,831,494 A | 5/1989 | Arnold et al. | 5,159,264 A | 10/1992 | Anderson |
| 4,838,802 A | 6/1989 | Soar | 5,159,267 A | 10/1992 | Anderson |
| 4,839,587 A | 6/1989 | Flatley et al. | 5,159,752 A | 11/1992 | Mahant-Shetti et al. |
| 4,845,426 A | 7/1989 | Nolan et al. | 5,160,883 A | 11/1992 | Blanz |
| 4,849,689 A | 7/1989 | Gleason et al. | 5,164,319 A | 11/1992 | Hafeman et al. |
| 4,853,613 A | 8/1989 | Sequeira et al. | 5,164,661 A | 11/1992 | Jones |
| 4,853,624 A | 8/1989 | Rabjohn | 5,166,606 A | 11/1992 | Blanz |
| 4,853,627 A | 8/1989 | Gleason et al. | 5,172,049 A | 12/1992 | Kiyokawa et al. |
| 4,856,426 A | 8/1989 | Wirz | 5,172,051 A | 12/1992 | Zamborelli |
| 4,856,904 A | 8/1989 | Akagawa | 5,187,443 A | 2/1993 | Bereskin |
| 4,858,160 A | 8/1989 | Strid et al. | 5,198,752 A | 3/1993 | Miyata et al. |
| 4,859,989 A | 8/1989 | McPherson | 5,198,753 A | 3/1993 | Hamburgen |
| 4,864,227 A | 9/1989 | Sato | 5,198,756 A | 3/1993 | Jenkins et al. |
| 4,871,883 A | 10/1989 | Guiol | 5,198,758 A | 3/1993 | Iknaian et al. |
| 4,871,965 A | 10/1989 | Elbert et al. | 5,202,558 A | 4/1993 | Barker |
| 4,884,026 A | 11/1989 | Hayakawa et al. | 5,209,088 A | 5/1993 | Vaks |
| 4,884,206 A | 11/1989 | Mate | 5,210,377 A | 5/1993 | Kennedy et al. |
| 4,888,550 A | 12/1989 | Reid | 5,210,485 A | 5/1993 | Kreiger et al. |
| 4,891,584 A | 1/1990 | Kamieniecki et al. | 5,214,243 A | 5/1993 | Johnson |
| 4,893,914 A | 1/1990 | Hancock et al. | 5,214,374 A | 5/1993 | St. Onge |
| 4,894,612 A | 1/1990 | Drake et al. | 5,218,185 A | 6/1993 | Gross |
| 4,896,109 A | 1/1990 | Rauscher | 5,220,277 A | 6/1993 | Reitinger |
| 4,899,998 A | 2/1990 | Teramachi | 5,221,905 A | 6/1993 | Bhangu et al. |
| 4,904,933 A | 2/1990 | Snyder et al. | 5,225,037 A | 7/1993 | Elder et al. |
| 4,904,935 A | 2/1990 | Calma et al. | 5,225,796 A | 7/1993 | Williams et al. |
| 4,906,920 A | 3/1990 | Huff et al. | 5,227,730 A | 7/1993 | King et al. |
| 4,916,398 A | 4/1990 | Rath | 5,232,789 A | 8/1993 | Platz et al. |
| 4,918,279 A | 4/1990 | Babel et al. | 5,233,197 A | 8/1993 | Bowman et al. |
| 4,918,374 A | 4/1990 | Stewart et al. | 5,233,291 A | 8/1993 | Kouno et al. |
| 4,918,383 A | 4/1990 | Huff et al. | 5,233,306 A | 8/1993 | Misra |
| 4,922,128 A | 5/1990 | Dhong et al. | 5,237,267 A | 8/1993 | Harwood et al. |
| 4,922,186 A | 5/1990 | Tsuchiya et al. | 5,245,292 A | 9/1993 | Milesky et al. |
| 4,923,407 A | 5/1990 | Rice et al. | 5,266,889 A | 11/1993 | Harwood et al. |
| 4,926,118 A | 5/1990 | O'Connor et al. | 5,267,088 A | 11/1993 | Nomura |
| 4,929,893 A | 5/1990 | Sato et al. | 5,270,664 A | 12/1993 | McMurtry et al. |
| 4,933,634 A | 6/1990 | Cuzin et al. | 5,274,336 A | 12/1993 | Crook et al. |
| 4,968,931 A | 11/1990 | Littlebury et al. | 5,278,494 A | 1/1994 | Obigane |
| 4,978,907 A | 12/1990 | Smith | 5,280,156 A | 1/1994 | Niori et al. |
| 4,978,914 A | 12/1990 | Akimoto et al. | 5,298,972 A | 3/1994 | Heffner |
| 4,982,153 A | 1/1991 | Collins et al. | 5,303,938 A | 4/1994 | Miller et al. |
| 4,994,737 A | 2/1991 | Carlton et al. | 5,304,924 A | 4/1994 | Yamano et al. |
| 5,001,423 A | 3/1991 | Abrami et al. | 5,315,237 A | 5/1994 | Iwakura et al. |
| 5,006,796 A | 4/1991 | Burton et al. | 5,321,352 A | 6/1994 | Takebuchi |
| 5,010,296 A | 4/1991 | Okada et al. | 5,321,453 A | 6/1994 | Mori et al. |
| 5,019,692 A | 5/1991 | Nbedi et al. | 5,325,052 A | 6/1994 | Yamashita |
| 5,030,907 A | 7/1991 | Yih et al. | 5,334,931 A | 8/1994 | Clarke et al. |
| 5,034,688 A | 7/1991 | Moulene et al. | 5,336,989 A | 8/1994 | Hofer |
| 5,041,782 A | 8/1991 | Marzan | 5,345,170 A | 9/1994 | Schwindt et al. |
| 5,045,781 A | 9/1991 | Gleason et al. | 5,357,211 A | 10/1994 | Bryson et al. |
| 5,061,823 A | 10/1991 | Carroll | 5,363,050 A | 11/1994 | Guo et al. |
| 5,065,089 A | 11/1991 | Rich | 5,369,368 A | 11/1994 | Kassen et al. |
| 5,065,092 A | 11/1991 | Sigler | 5,369,370 A | 11/1994 | Stratmann et al. |
| 5,066,357 A | 11/1991 | Smyth, Jr. et al. | 5,371,457 A | 12/1994 | Lipp |
| 5,070,297 A | 12/1991 | Kwon et al. | 5,373,231 A | 12/1994 | Boll et al. |
| 5,077,523 A | 12/1991 | Blanz | 5,374,938 A | 12/1994 | Hatazawa et al. |
| 5,082,627 A | 1/1992 | Stanbro | 5,376,790 A | 12/1994 | Linker et al. |
| 5,084,671 A | 1/1992 | Miyata et al. | 5,382,898 A | 1/1995 | Subramanian |
| 5,089,774 A | 2/1992 | Nakano | 5,397,855 A | 3/1995 | Ferlier |
| 5,091,691 A | 2/1992 | Kamieniecki et al. | 5,404,111 A | 4/1995 | Mori et al. |
| 5,091,692 A | 2/1992 | Ohno et al. | 5,408,188 A | 4/1995 | Katoh |
| 5,091,732 A | 2/1992 | Mileski et al. | 5,408,189 A | 4/1995 | Swart et al. |
| 5,094,536 A | 3/1992 | MacDonald et al. | 5,410,259 A | 4/1995 | Fujihara et al. |
| 5,095,891 A | 3/1992 | Reitter | 5,412,330 A | 5/1995 | Ravel et al. |
| 5,097,207 A | 3/1992 | Blanz | 5,412,866 A | 5/1995 | Woith et al. |

| | | | | | |
|---|---|---|---|---|---|
| 5,414,565 A | 5/1995 | Sullivan et al. | 5,663,653 A | 9/1997 | Schwindt et al. |
| 5,422,574 A | 6/1995 | Kister | 5,666,063 A | 9/1997 | Abercrombie et al. |
| 5,434,512 A | 7/1995 | Schwindt et al. | 5,668,470 A | 9/1997 | Shelor |
| 5,448,172 A | 9/1995 | Dechene et al. | 5,669,316 A | 9/1997 | Faz et al. |
| 5,451,884 A | 9/1995 | Sauerland | 5,670,322 A | 9/1997 | Eggers et al. |
| 5,457,398 A | 10/1995 | Schwindt et al. | 5,670,888 A | 9/1997 | Cheng |
| 5,461,328 A | 10/1995 | Devereaux et al. | 5,672,816 A | 9/1997 | Park et al. |
| 5,467,024 A | 11/1995 | Swapp | 5,675,499 A | 10/1997 | Lee et al. |
| 5,469,324 A | 11/1995 | Henderson et al. | 5,675,932 A | 10/1997 | Mauney |
| 5,475,316 A | 12/1995 | Hurley et al. | 5,676,360 A | 10/1997 | Boucher et al. |
| 5,477,011 A | 12/1995 | Singles et al. | 5,680,039 A | 10/1997 | Mochizuki et al. |
| 5,478,748 A | 12/1995 | Akins, Jr. et al. | 5,682,337 A | 10/1997 | El-Fishaway et al. |
| 5,479,108 A | 12/1995 | Cheng | 5,685,232 A | 11/1997 | Inoue |
| 5,479,109 A | 12/1995 | Lau et al. | 5,704,355 A | 1/1998 | Bridges |
| 5,481,196 A | 1/1996 | Nosov | 5,712,571 A | 1/1998 | O'Donoghue |
| 5,481,936 A | 1/1996 | Yanagisawa | 5,715,819 A | 2/1998 | Svenson et al. |
| 5,486,975 A | 1/1996 | Shamouilian et al. | 5,729,150 A | 3/1998 | Schwindt |
| 5,488,954 A | 2/1996 | Sleva et al. | 5,731,708 A | 3/1998 | Shobhami |
| 5,491,426 A | 2/1996 | Small | 5,731,920 A | 3/1998 | Katsuragawa |
| 5,493,070 A | 2/1996 | Habu | 5,744,971 A | 4/1998 | Chan et al. |
| 5,493,236 A | 2/1996 | Ishii et al. | 5,748,506 A | 5/1998 | Bockelman |
| 5,500,606 A | 3/1996 | Holmes | 5,751,252 A | 5/1998 | Phillips |
| 5,505,150 A | 4/1996 | James et al. | 5,767,690 A | 6/1998 | Fujimoto |
| 5,506,498 A | 4/1996 | Anderson et al. | 5,773,951 A | 6/1998 | Markowski et al. |
| 5,506,515 A | 4/1996 | Godshalk et al. | 5,777,485 A | 7/1998 | Tanaka et al. |
| 5,508,631 A | 4/1996 | Manku et al. | 5,792,668 A | 8/1998 | Fuller et al. |
| 5,510,792 A | 4/1996 | Ono et al. | 5,793,213 A | 8/1998 | Bockelman et al. |
| 5,511,010 A | 4/1996 | Burns | 5,794,133 A | 8/1998 | Kashima |
| 5,512,835 A | 4/1996 | Rivera et al. | 5,798,652 A | 8/1998 | Taraci |
| 5,515,167 A | 5/1996 | Ledger et al. | 5,802,856 A | 9/1998 | Schaper et al. |
| 5,517,111 A | 5/1996 | Shelor | 5,804,982 A | 9/1998 | Lo et al. |
| 5,521,522 A | 5/1996 | Abe et al. | 5,804,983 A | 9/1998 | Nakajima et al. |
| 5,523,694 A | 6/1996 | Cole, Jr. | 5,807,107 A | 9/1998 | Bright et al. |
| 5,528,158 A | 6/1996 | Sinsheimer et al. | 5,811,751 A | 9/1998 | Leong et al. |
| 5,530,371 A | 6/1996 | Perry et al. | 5,824,494 A | 10/1998 | Feldberg |
| 5,530,372 A | 6/1996 | Lee et al. | 5,828,225 A | 10/1998 | Obikane et al. |
| 5,532,609 A | 7/1996 | Harwood et al. | 5,829,437 A | 11/1998 | Bridges |
| 5,539,323 A | 7/1996 | Davis, Jr. | 5,831,442 A | 11/1998 | Heigl |
| 5,539,676 A | 7/1996 | Yamaguchi | 5,833,601 A | 11/1998 | Swartz et al. |
| 5,546,012 A | 8/1996 | Perry et al. | 5,835,997 A | 11/1998 | Yassine |
| 5,550,480 A | 8/1996 | Nelson et al. | 5,838,161 A | 11/1998 | Akram et al. |
| 5,550,482 A | 8/1996 | Sano | 5,841,288 A | 11/1998 | Meaney et al. |
| 5,552,716 A | 9/1996 | Takahashi et al. | 5,846,708 A | 12/1998 | Hollis et al. |
| 5,554,236 A | 9/1996 | Singles et al. | 5,847,569 A | 12/1998 | Ho et al. |
| 5,561,377 A | 10/1996 | Strid et al. | 5,848,500 A | 12/1998 | Kirk |
| 5,561,585 A | 10/1996 | Barnes et al. | 5,852,232 A | 12/1998 | Samsavar et al. |
| 5,565,788 A | 10/1996 | Burr et al. | 5,854,608 A | 12/1998 | Leisten |
| 5,565,881 A | 10/1996 | Phillips et al. | 5,857,667 A | 1/1999 | Lee |
| 5,569,591 A | 10/1996 | Kell et al. | 5,861,743 A | 1/1999 | Pye et al. |
| 5,571,324 A | 11/1996 | Sago et al. | 5,867,073 A | 2/1999 | Weinreb et al. |
| 5,572,398 A | 11/1996 | Federlin et al. | 5,869,326 A | 2/1999 | Hofmann |
| 5,578,932 A | 11/1996 | Adamian | 5,869,975 A | 2/1999 | Strid et al. |
| 5,583,445 A | 12/1996 | Mullen | 5,874,361 A | 2/1999 | Collins et al. |
| 5,584,608 A | 12/1996 | Gillespie | 5,879,289 A | 3/1999 | Yarush et al. |
| 5,594,358 A | 1/1997 | Ishikawa et al. | 5,883,522 A | 3/1999 | O'Boyle |
| 5,600,256 A | 2/1997 | Woith et al. | 5,883,523 A | 3/1999 | Ferland et al. |
| 5,604,444 A | 2/1997 | Harwood et al. | 5,888,075 A | 3/1999 | Hasegawa et al. |
| 5,610,529 A | 3/1997 | Schwindt | 5,892,539 A | 4/1999 | Colvin |
| 5,611,946 A | 3/1997 | Leong et al. | 5,900,737 A | 5/1999 | Graham et al. |
| 5,617,035 A | 4/1997 | Swapp | 5,903,143 A | 5/1999 | Mochizuki et al. |
| 5,628,057 A | 5/1997 | Phillips et al. | 5,905,421 A | 5/1999 | Oldfield |
| 5,629,631 A | 5/1997 | Perry et al. | 5,910,727 A | 6/1999 | Fujihara et al. |
| 5,631,571 A | 5/1997 | Spaziani et al. | 5,916,689 A | 6/1999 | Collins et al. |
| 5,633,780 A | 5/1997 | Cronin | 5,923,177 A | 7/1999 | Wardwell |
| 5,640,101 A | 6/1997 | Kuji et al. | 5,926,028 A | 7/1999 | Mochizuki |
| 5,642,298 A | 6/1997 | Mallory et al. | 5,942,907 A | 8/1999 | Chiang |
| 5,644,248 A | 7/1997 | Fujimoto | 5,944,093 A | 8/1999 | Viswanath |
| 5,646,538 A | 7/1997 | Lide et al. | 5,945,836 A | 8/1999 | Sayre et al. |
| 5,653,939 A | 8/1997 | Hollis et al. | 5,949,383 A | 9/1999 | Hayes et al. |
| 5,656,942 A | 8/1997 | Watts et al. | 5,949,579 A | 9/1999 | Baker |
| 5,657,394 A | 8/1997 | Schwartz et al. | 5,952,842 A | 9/1999 | Fujimoto |
| 5,659,255 A | 8/1997 | Strid et al. | 5,959,461 A | 9/1999 | Brown et al. |
| 5,659,421 A | 8/1997 | Rahmel et al. | 5,960,411 A | 9/1999 | Hartman et al. |

| | | | | | | |
|---|---|---|---|---|---|---|
| 5,963,027 | A | 10/1999 | Peters | 6,194,907 B1 | 2/2001 | Kanao et al. |
| 5,963,364 | A | 10/1999 | Leong et al. | 6,198,299 B1 | 3/2001 | Hollman |
| 5,970,429 | A | 10/1999 | Martin | 6,211,663 B1 | 4/2001 | Moulthrop et al. |
| 5,973,505 | A | 10/1999 | Strid et al. | 6,211,837 B1 | 4/2001 | Crouch et al. |
| 5,974,662 | A | 11/1999 | Eldridge et al. | 6,215,295 B1 | 4/2001 | Smith, III |
| 5,981,268 | A | 11/1999 | Kovacs et al. | 6,222,031 B1 | 4/2001 | Wakabayashi et al. |
| 5,982,166 | A | 11/1999 | Mautz | 6,222,970 B1 | 4/2001 | Wach et al. |
| 5,993,611 | A | 11/1999 | Moroney, III et al. | 6,229,322 B1 | 5/2001 | Hembree |
| 5,995,914 | A | 11/1999 | Cabot | 6,229,327 B1 | 5/2001 | Boll et al. |
| 5,996,102 | A | 11/1999 | Haulin | 6,232,787 B1 | 5/2001 | Lo et al. |
| 5,998,768 | A | 12/1999 | Hunter et al. | 6,232,788 B1 | 5/2001 | Schwindt et al. |
| 5,999,268 | A | 12/1999 | Yonezawa et al. | 6,232,789 B1 | 5/2001 | Schwindt |
| 6,001,760 | A | 12/1999 | Katsuda et al. | 6,232,790 B1 | 5/2001 | Bryan et al. |
| 6,002,236 | A | 12/1999 | Trant et al. | 6,233,613 B1 | 5/2001 | Walker et al. |
| 6,002,263 | A | 12/1999 | Peters et al. | 6,236,223 B1 | 5/2001 | Brady et al. |
| 6,002,426 | A | 12/1999 | Back et al. | 6,236,975 B1 | 5/2001 | Boe et al. |
| 6,013,586 | A | 1/2000 | McGhee et al. | 6,236,977 B1 | 5/2001 | Verba et al. |
| 6,019,612 | A | 2/2000 | Hasegawa et al. | 6,242,929 B1 | 6/2001 | Mizuta |
| 6,023,209 | A | 2/2000 | Faulkner et al. | 6,245,692 B1 | 6/2001 | Pearce et al. |
| 6,028,435 | A | 2/2000 | Nikawa | 6,251,595 B1 | 6/2001 | Gordon et al. |
| 6,029,141 | A | 2/2000 | Bezos et al. | 6,252,392 B1 | 6/2001 | Peters |
| 6,031,383 | A | 2/2000 | Streib et al. | 6,257,319 B1 | 7/2001 | Kainuma et al. |
| 6,032,714 | A | 3/2000 | Fenton | 6,257,564 B1 | 7/2001 | Avneri et al. |
| 6,034,533 | A | 3/2000 | Tervo et al. | 6,259,261 B1 | 7/2001 | Engelking et al. |
| 6,037,785 | A | 3/2000 | Higgins | 6,265,950 B1 | 7/2001 | Schmidt et al. |
| 6,037,793 | A | 3/2000 | Miyazawa et al. | 6,271,673 B1 | 8/2001 | Furuta et al. |
| 6,043,667 | A | 3/2000 | Cadwallader et al. | 6,275,738 B1 | 8/2001 | Kasevich et al. |
| 6,043,668 | A | 3/2000 | Carney | 6,278,051 B1 | 8/2001 | Peabody |
| 6,049,216 | A | 4/2000 | Yang et al. | 6,278,411 B1 | 8/2001 | Ohlsson et al. |
| 6,051,422 | A | 4/2000 | Kovacs et al. | 6,281,691 B1 | 8/2001 | Matsunaga et al. |
| 6,052,653 | A | 4/2000 | Mazur et al. | 6,284,971 B1 | 9/2001 | Atalar et al. |
| 6,054,869 | A | 4/2000 | Hutton et al. | 6,288,557 B1 | 9/2001 | Peters et al. |
| 6,060,888 | A | 5/2000 | Blackham et al. | 6,292,760 B1 | 9/2001 | Burns |
| 6,060,891 | A | 5/2000 | Hembree et al. | 6,300,775 B1 | 10/2001 | Peach et al. |
| 6,060,892 | A | 5/2000 | Yamagata | 6,307,672 B1 | 10/2001 | DeNure |
| 6,061,589 | A | 5/2000 | Bridges et al. | 6,310,483 B1 | 10/2001 | Taura et al. |
| 6,064,213 | A | 5/2000 | Khandros et al. | 6,310,755 B1 | 10/2001 | Kholodenko et al. |
| 6,064,217 | A | 5/2000 | Smith | 6,313,567 B1 | 11/2001 | Maltabes et al. |
| 6,064,218 | A | 5/2000 | Godfrey et al. | 6,313,649 B2 | 11/2001 | Harwood et al. |
| 6,066,911 | A | 5/2000 | Lindemann et al. | 6,320,372 B1 | 11/2001 | Keller |
| 6,078,183 | A | 6/2000 | Cole, Jr. | 6,320,396 B1 | 11/2001 | Nikawa |
| 6,091,236 | A | 7/2000 | Piety et al. | 6,327,034 B1 | 12/2001 | Hoover et al. |
| 6,091,255 | A | 7/2000 | Godfrey | 6,335,625 B1 | 1/2002 | Bryant et al. |
| 6,096,567 | A | 8/2000 | Kaplan et al. | 6,335,628 B2 | 1/2002 | Schwindt et al. |
| 6,100,815 | A | 8/2000 | Pailthorp | 6,340,568 B2 | 1/2002 | Hefti |
| 6,104,203 | A | 8/2000 | Costello et al. | 6,340,895 B1 | 1/2002 | Uher et al. |
| 6,104,206 | A | 8/2000 | Verkuil | 6,359,456 B1 | 3/2002 | Hembree et al. |
| 6,111,419 | A | 8/2000 | Lefever et al. | 6,362,636 B1 | 3/2002 | Peters et al. |
| 6,114,865 | A | 9/2000 | Lagowski et al. | 6,362,792 B1 | 3/2002 | Sawamura et al. |
| 6,118,287 | A | 9/2000 | Boll et al. | 6,366,247 B1 | 4/2002 | Sawamura et al. |
| 6,118,894 | A | 9/2000 | Schwartz et al. | 6,369,776 B1 | 4/2002 | Leisten et al. |
| 6,121,783 | A | 9/2000 | Horner et al. | 6,376,258 B2 | 4/2002 | Hefti |
| 6,124,723 | A | 9/2000 | Costello | 6,380,751 B2 | 4/2002 | Harwood et al. |
| 6,124,725 | A | 9/2000 | Sato | 6,384,614 B1 | 5/2002 | Hager et al. |
| 6,127,831 | A | 10/2000 | Khoury et al. | 6,395,480 B1 | 5/2002 | Hefti |
| 6,130,544 | A | 10/2000 | Strid et al. | 6,396,296 B1 | 5/2002 | Tartar et al. |
| 6,137,302 | A | 10/2000 | Schwindt | 6,396,298 B1 | 5/2002 | Young et al. |
| 6,137,303 | A | 10/2000 | Deckert et al. | 6,400,168 B2 | 6/2002 | Matsunaga et al. |
| 6,144,212 | A | 11/2000 | Mizuta | 6,404,213 B2 | 6/2002 | Noda |
| 6,147,502 | A | 11/2000 | Fryer et al. | 6,407,560 B1 | 6/2002 | Walraven et al. |
| 6,147,851 | A | 11/2000 | Anderson | 6,407,562 B1 | 6/2002 | Whiteman |
| 6,160,407 | A | 12/2000 | Nikawa | 6,409,724 B1 | 6/2002 | Penny et al. |
| 6,166,553 | A | 12/2000 | Sinsheimer | 6,414,478 B1 | 7/2002 | Suzuki |
| 6,169,410 | B1 | 1/2001 | Grace et al. | 6,415,858 B1 | 7/2002 | Getchel et al. |
| 6,172,337 | B1 | 1/2001 | Johnsgard et al. | 6,418,009 B1 | 7/2002 | Brunette |
| 6,175,228 | B1 | 1/2001 | Zamborelli et al. | 6,420,722 B2 | 7/2002 | Moore et al. |
| 6,181,144 | B1 | 1/2001 | Hembree et al. | 6,424,141 B1 | 7/2002 | Hollman et al. |
| 6,181,149 | B1 | 1/2001 | Godfrey et al. | 6,424,316 B1 | 7/2002 | Leisten et al. |
| 6,181,297 | B1 | 1/2001 | Leisten | 6,445,202 B1 | 9/2002 | Cowan et al. |
| 6,181,416 | B1 | 1/2001 | Falk | 6,447,339 B1 | 9/2002 | Reed et al. |
| 6,184,845 | B1 | 2/2001 | Leisten et al. | 6,448,788 B1 | 9/2002 | Meaney et al. |
| 6,191,596 | B1 | 2/2001 | Abiko | 6,459,739 B1 | 10/2002 | Vitenberg |
| 6,194,720 | B1 | 2/2001 | Li et al. | 6,466,046 B1 | 10/2002 | Maruyama et al. |

| | | |
|---|---|---|
| 6,468,816 B2 | 10/2002 | Hunter |
| 6,476,442 B1 | 11/2002 | Williams et al. |
| 6,480,013 B1 | 11/2002 | Nayler et al. |
| 6,481,939 B1 | 11/2002 | Gillespie et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,490,471 B2 | 12/2002 | Svenson et al. |
| 6,492,822 B2 | 12/2002 | Schwindt et al. |
| 6,501,289 B1 | 12/2002 | Takekoshi |
| 6,512,482 B1 | 1/2003 | Nelson et al. |
| 6,515,494 B1 | 2/2003 | Low |
| 6,528,993 B1 | 3/2003 | Shin et al. |
| 6,529,844 B1 | 3/2003 | Kapetanic et al. |
| 6,548,311 B1 | 4/2003 | Knoll |
| 6,549,022 B1 | 4/2003 | Cole, Jr. et al. |
| 6,549,026 B1 | 4/2003 | Dibattista et al. |
| 6,549,106 B2 | 4/2003 | Martin |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,603,322 B1 | 8/2003 | Boll et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,611,417 B2 | 8/2003 | Chen |
| 6,617,862 B1 | 9/2003 | Bruce |
| 6,621,082 B2 | 9/2003 | Morita et al. |
| 6,624,891 B2 | 9/2003 | Marcus et al. |
| 6,627,461 B2 | 9/2003 | Chapman et al. |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 | 10/2003 | Harwood et al. |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,650,135 B1 | 11/2003 | Mautz et al. |
| 6,653,903 B2 | 11/2003 | Leich et al. |
| 6,657,601 B2 | 12/2003 | McLean |
| 6,686,753 B1 | 2/2004 | Kitahata |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 | 5/2004 | Hyakudomi |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 | 6/2004 | Hunter |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 * | 12/2004 | Harris et al. ............ 324/765 |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 * | 3/2005 | Goto et al. ............ 324/754 |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,580 B2 | 7/2005 | Leisten |
| 6,924,656 B2 | 8/2005 | Matsumoto |
| 6,927,079 B1 | 8/2005 | Fyfield |
| 6,937,341 B1 | 8/2005 | Woollam et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |

| | | | | | | |
|---|---|---|---|---|---|---|
| 7,026,832 B2 | 4/2006 | Chaya et al. | 2004/0100297 A1 | 5/2004 | Tanioka et al. | |
| 7,026,833 B2 | 4/2006 | Rincon et al. | 2004/0108847 A1 | 6/2004 | Stoll et al. | |
| 7,026,834 B2 | 4/2006 | Hwang | 2004/0113639 A1 | 6/2004 | Dunklee et al. | |
| 7,026,835 B2 | 4/2006 | Farnworth et al. | 2004/0113640 A1 | 6/2004 | Cooper et al. | |
| 7,030,599 B2 | 4/2006 | Douglas | 2004/0130787 A1 | 7/2004 | Thome-Forster et al. | |
| 7,030,827 B2 | 4/2006 | Mahler et al. | 2004/0132222 A1 | 7/2004 | Hembree et al. | |
| 7,032,307 B2 | 4/2006 | Matsunaga et al. | 2004/0134899 A1 | 7/2004 | Hiramatsu et al. | |
| 7,034,553 B2 | 4/2006 | Gilboe | 2004/0147034 A1 | 7/2004 | Gore et al. | |
| 7,035,738 B2 | 4/2006 | Matsumoto et al. | 2004/0162689 A1 | 8/2004 | Jamneala et al. | |
| 7,088,981 B2 | 8/2006 | Chang | 2004/0175294 A1 | 9/2004 | Ellison et al. | |
| 7,096,133 B1 | 8/2006 | Martin et al. | 2004/0186382 A1 | 9/2004 | Modell et al. | |
| 7,101,797 B2 | 9/2006 | Yuasa | 2004/0193382 A1 | 9/2004 | Adamian et al. | |
| 7,187,188 B2 | 3/2007 | Andrews et al. | 2004/0197771 A1 | 10/2004 | Powers et al. | |
| 7,188,037 B2 | 3/2007 | Hidehira | 2004/0199350 A1 | 10/2004 | Blackham et al. | |
| 7,221,172 B2 | 5/2007 | Dunklee | 2004/0207072 A1 | 10/2004 | Hiramatsu et al. | |
| 7,250,779 B2 | 7/2007 | Dunklee et al. | 2004/0207424 A1 | 10/2004 | Hollman | |
| 2001/0002794 A1 | 6/2001 | Draving et al. | 2004/0239338 A1 | 12/2004 | Johnsson et al. | |
| 2001/0009377 A1 | 7/2001 | Schwindt et al. | 2004/0246004 A1 | 12/2004 | Heuermann | |
| 2001/0010468 A1 | 8/2001 | Gleason et al. | 2004/0251922 A1 | 12/2004 | Martens et al. | |
| 2001/0020283 A1 | 9/2001 | Sakaguchi | 2004/0267691 A1 | 12/2004 | Vasudeva | |
| 2001/0024116 A1 | 9/2001 | Draving | 2005/0024069 A1 | 2/2005 | Hayden et al. | |
| 2001/0030549 A1 | 10/2001 | Gleason et al. | 2005/0026276 A1 | 2/2005 | Chou | |
| 2001/0043073 A1 | 11/2001 | Montoya | 2005/0030047 A1 | 2/2005 | Adamian | |
| 2001/0044152 A1 | 11/2001 | Burnett | 2005/0054029 A1 | 3/2005 | Tomimatsu et al. | |
| 2001/0045511 A1 | 11/2001 | Moore et al. | 2005/0062533 A1 | 3/2005 | Vice | |
| 2001/0054906 A1 | 12/2001 | Fujimura | 2005/0083130 A1 | 4/2005 | Grilo | |
| 2002/0005728 A1 | 1/2002 | Babson et al. | 2005/0099192 A1 | 5/2005 | Dunklee et al. | |
| 2002/0008533 A1 | 1/2002 | Ito et al. | 2005/0101846 A1 | 5/2005 | Fine et al. | |
| 2002/0009377 A1 | 1/2002 | Shafer | 2005/0156675 A1 | 7/2005 | Rohde et al. | |
| 2002/0009378 A1 | 1/2002 | Obara | 2005/0164160 A1 | 7/2005 | Gunter et al. | |
| 2002/0011859 A1 | 1/2002 | Smith et al. | 2005/0165316 A1 | 7/2005 | Lowery et al. | |
| 2002/0011863 A1 | 1/2002 | Takahashi et al. | 2005/0168722 A1 | 8/2005 | Forstner et al. | |
| 2002/0050828 A1 | 5/2002 | Seward, IV et al. | 2005/0174191 A1 | 8/2005 | Brunker et al. | |
| 2002/0066551 A1 | 6/2002 | Stone et al. | 2005/0178980 A1 | 8/2005 | Skidmore et al. | |
| 2002/0070743 A1 | 6/2002 | Felici et al. | 2005/0195124 A1 | 9/2005 | Puente Baliarda et al. | |
| 2002/0070745 A1 | 6/2002 | Johnson et al. | 2005/0227503 A1 | 10/2005 | Reitinger | |
| 2002/0075027 A1 | 6/2002 | Hollman et al. | 2005/0236587 A1 | 10/2005 | Kodama et al. | |
| 2002/0079911 A1 | 6/2002 | Schwindt | 2005/0237102 A1 | 10/2005 | Tanaka | |
| 2002/0118009 A1 | 8/2002 | Hollman et al. | 2006/0052075 A1 | 3/2006 | Galivanche et al. | |
| 2002/0118034 A1 | 8/2002 | Laureanti | 2006/0114012 A1 | 6/2006 | Reitinger | |
| 2002/0149377 A1 | 10/2002 | Hefti et al. | 2006/0155270 A1 | 7/2006 | Hancock et al. | |
| 2002/0153909 A1 | 10/2002 | Petersen et al. | 2006/0158207 A1 | 7/2006 | Reitinger | |
| 2002/0163769 A1 | 11/2002 | Brown | 2006/0226864 A1 | 10/2006 | Kramer | |
| 2002/0168659 A1 | 11/2002 | Hefti et al. | 2007/0024506 A1 | 2/2007 | Hardacker | |
| 2002/0180466 A1 | 12/2002 | Hiramatsu et al. | 2007/0030021 A1 | 2/2007 | Cowan et al. | |
| 2002/0197709 A1 | 12/2002 | Van der Weide et al. | | | | |
| 2003/0010877 A1 | 1/2003 | Landreville et al. | FOREIGN PATENT DOCUMENTS | | | |
| 2003/0030822 A1 | 2/2003 | Finarov | DE | 29 12 826 | 10/1980 | |
| 2003/0032000 A1 | 2/2003 | Liu et al. | DE | 31 14 466 | 3/1982 | |
| 2003/0040004 A1 | 2/2003 | Hefti et al. | DE | 31 25 552 | 11/1982 | |
| 2003/0057513 A1 | 3/2003 | Leedy | DE | 3637549 | 5/1988 | |
| 2003/0062915 A1 | 4/2003 | Arnold et al. | DE | 41 09 908 | 10/1992 | |
| 2003/0071631 A1 | 4/2003 | Alexander | DE | 43 16 111 | 11/1994 | |
| 2003/0072549 A1 | 4/2003 | Facer et al. | DE | 94 06 227 | 10/1995 | |
| 2003/0077649 A1 | 4/2003 | Cho et al. | DE | 195 41 334 | 9/1996 | |
| 2003/0088180 A1 | 5/2003 | VanVeen et al. | DE | 196 16 212 | 10/1996 | |
| 2003/0119057 A1 | 6/2003 | Gascoyne et al. | DE | 19522774 | 1/1997 | |
| 2003/0139662 A1 | 7/2003 | Seidman | DE | 196 18 717 | 1/1998 | |
| 2003/0139790 A1 | 7/2003 | Ingle et al. | DE | 288 234 | 3/1999 | |
| 2003/0141861 A1 | 7/2003 | Navratil et al. | DE | 693 22 206 | 4/1999 | |
| 2003/0155939 A1 | 8/2003 | Lutz et al. | DE | 10000324 | 7/2001 | |
| 2003/0156270 A1 | 8/2003 | Hunter | EP | 0 087 497 | 9/1983 | |
| 2003/0170898 A1 | 9/2003 | Gunderson et al. | EP | 0 201 205 | 12/1986 | |
| 2003/0184332 A1 | 10/2003 | Tomimatsu et al. | EP | 0 314 481 | 5/1989 | |
| 2004/0015060 A1 | 1/2004 | Samsoondar et al. | EP | 0 333 521 | 9/1989 | |
| 2004/0021475 A1 | 2/2004 | Ito et al. | EP | 0 460 911 | 12/1991 | |
| 2004/0061514 A1 | 4/2004 | Schwindt et al. | EP | 0 574 149 A1 | 5/1993 | |
| 2004/0066181 A1 | 4/2004 | Thies | EP | 0 574 149 | 12/1993 | |
| 2004/0069776 A1 | 4/2004 | Fagrell et al. | EP | 0 706 210 | 4/1996 | |
| 2004/0090223 A1 | 5/2004 | Yonezawa | EP | 0 505 981 | 6/1998 | |
| 2004/0095145 A1 | 5/2004 | Boudiaf et al. | EP | 0 573 183 | 1/1999 | |
| 2004/0095641 A1 | 5/2004 | Russum et al. | EP | 0 945 736 | 9/1999 | |
| 2004/0100276 A1 | 5/2004 | Fanton | | | | |

| | | |
|---|---|---|
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-011243 | 1/1987 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7005078 | 1/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002033374 | 1/2002 |
| JP | 2002-164396 | 6/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th European Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D. Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between—196 and 350° C, " U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68th Street, Mercer Island, Washington 98040.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages.

Mark S. Boguski & Martin W. McIntosh, "Biomedical informatics for proteomics," Insight: review article, Nature 422, Mar. 13, 2003, pp. 233-237.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Cascade Microtech, "Advanced On-Wafer Device Characterization Using the Summit 10500," pp. 2-20.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure For low temperature wafer probing in a moisture-free environment," 2 pages.

*Cascade Microtech, Inc.* vs. *Micromanipulator Company, Inc.*, "Deposition of Harry F. Applebay," United States District Court for the District of Oregon. Lead Case No. 97-479-AI.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

* cited by examiner

THERMAL OPTICAL CHUCK

CROSS-REFERENCE TO RELATED APPLICATIONS

This application is a continuation of U.S. patent application Ser. No. 11/123,687, filed May 6, 2005, now U.S Pat No. 7,176,705 B2; which application claims the benefit of U.S. Provisional App. No. 60/577,752, filed Jun. 7, 2004.

STATEMENT REGARDING FEDERALLY SPONSORED RESEARCH OR DEVELOPMENT

Not applicable.

BACKGROUND OF THE INVENTION

The present invention relates to a chuck for supporting a device under test (DUT) in a probe station and, more particularly, to a chuck adapted to testing electrical and optical properties of a DUT at a temperature other than the ambient temperature.

Many electrical devices, in particular semiconductor based devices, include both electrical components and optical components. Some electro-optical devices receive an optical signal from an optical source and convert the received optical signal into an electrical signal, e.g., a photo-detector. Other electro-optical devices convert an electrical signal into an optical signal, e.g., a light-emitting-diode. Yet other electro-optical devices may include multiple optical and/or electrical components. A probe station may be used to characterize the operation of these devices.

In a probe station, an electrical device-under-test (DUT) is commonly supported on and restrained to the upper surface a chuck while probes are positioned above test pads on the upper surface of the DUT and then brought into contact with the test pads during measurement of the device's operating parameters. The chuck is usually supported on a movable stage permitting movement the chuck to facilitate aligning the probes with the test pads of the DUT. However, an electro-optical device commonly includes electrical connections on a first surface of the device and optical input or output at another surface of the device. For example, an optical signal from a light source may be directed toward the DUT from below, above, or to the side of the DUT while a probe or connector on the upper surface is used to sense the resulting electrical output from the DUT. Similarly for example, a probe or connector may be used to provide an electrical excitation at the upper surface of the DUT while an optical sensor located below, above, or to the side of the DUT is used to sense the resulting optical output.

An optical chuck may used in a probe station to support a DUT that requires an optically accessible path to a surface of the DUT that is normally blocked by the chuck. Harris et al., Patent Application Publication, Pub. No.: US 2003/0042889 A1, incorporated herein by reference, disclose an optical chuck that includes a central, optically transparent medium over which the DUT is supported to provide an optically accessible path to all sides of the DUT. The DUT and the optically transparent medium are supported above a base by a plurality of columnar supports permitting an optical transducer to be located below the transparent window to either sense optical output from the DUT or transmit optical signals to the DUT from below.

While an optical chuck provides an access path for optical signals to or from a DUT, it is often desired to test these devices at a temperature other than the ambient temperature. Thermal chucks are commonly used for testing electrical DUTs at elevated or depressed temperatures. A thermal chuck typically includes a heat source to raise the temperature of the surface of the chuck supporting the DUT and, as a result, the temperature of the DUT. Typically, probe station thermal chucks are heated by thermoelectric devices that rely on the Peltier effect or wire resistance heaters. However, these devices are optically opaque and would interfere with an optical path to the DUT if used to modify the temperature of an optical chuck.

What is desired, therefore, is a thermal optical chuck for use in a probe station that permits a DUT supported on a surface of the chuck to be tested at a temperature other than ambient while providing optical access to the underside the DUT.

DETAILED DESCRIPTION OF THE INVENTION

Testing devices having electrical and optical components involves applying measured electrical or optical inputs and measuring electrical or optical outputs. The electrical inputs and outputs are typically applied and measured by instruments connected to the device by connectors and/or conductive probes and the optical inputs and outputs are typically determined by optical sensors optically coupled to the device. The overall operational characteristics of the device may be characterized from the outputs to the various instruments when the device-under-test (DUT) is electrically and/or optically excited. Often the electrical and optical inputs and outputs to a DUT are arranged on different surfaces of the device. For example, a device may have test pads for electrical excitation located on a first (upper) surface while an optical output is directed from the opposing (lower) surface. An optical chuck provides an optically accessible path to the lower surface of a DUT so that an optical transducer may be positioned below the DUT to either expose the lower surface of the DUT to an optical input or intercept an optical output from the lower surface of the DUT while the upper surface of the DUT is accessible to probes or connectors for making electrical connections.

However, it is often desirable to characterize the DUT at an elevated temperature to simulate the environment in which the device will be used or to determine its performance under operating conditions that stress the device. While an optical chuck provides an accessible optical path to the lower surface of a DUT, the heating devices normally used to modify the temperature of probe station chucks are optically opaque and would interfere with optical access to the DUT if placed in the optical path. The inventor concluded that a thermal optical chuck having an optically transparent heating device could provide a combination of optical accessibility to the lower surface of the DUT and the ability to modify the temperature of the DUT.

Figure 1:
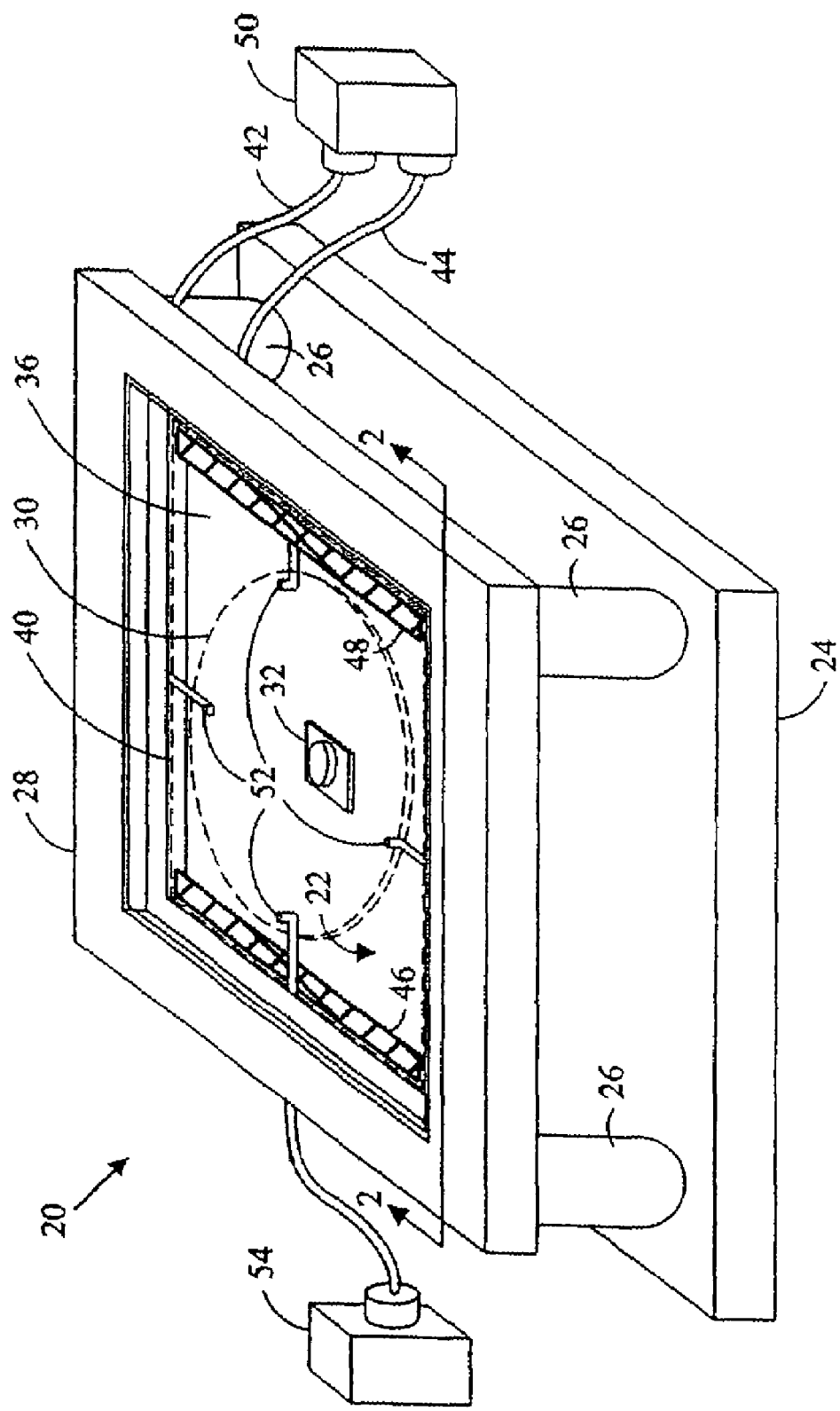
FIG. 1 is a perspective view of a thermal optical chuck assembly illustrating the positioning of an exemplary device-under-test and an optical device for detecting an optical output or supplying an optical input at the lower surface of the device.
Figure 2:
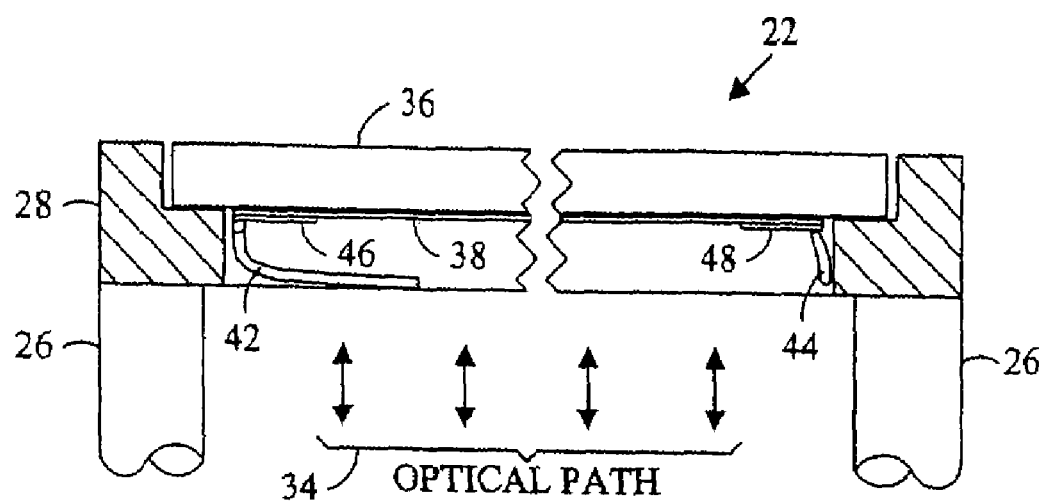
FIG. 2 is a sectional view of the thermal optical chuck of FIG. 1 taken along line 2-2.

Referring in detail to the drawings where similar parts of the invention are identified by like reference numerals, and referring in particular to FIG. 1, a thermal optical chuck assembly 20 suitable for use in a probe station comprises generally a thermal optical chuck 22 supported above a base 24 in a frame 28 by a plurality of supports 26. The base 24 is arranged to be supported on a movable stage in a probe station permitting the position of the chuck and the DUT to be moved to facilitate access to the upper surface of the DUT 30. The spaced relationship of the base 24 and the thermal optical chuck 22 permits optical devices, such as the exemplary optical transducer 32, to be positioned between the base and the thermal optical chuck to either direct optical signals to the lower surface of the DUT 30 or receive the output of optical elements on the lower surface of the DUT. Referring also to FIG. 2, the thermal optical chuck 22 is optically transparent providing an accessible optical path 34 to the lower surface of a DUT supported on the upper surface of the thermal optical chuck.

The thermal optical chuck 22 comprises a transparent plate 36 supported by the frame 28 that is, in turn, supported above the base 24 by the supports 26. The transparent plate 36 may comprise one or more of a variety of commercially available materials; such as, glass, quartz, sapphire, lithium niobate, and fused silica that are transparent to one or more wavelengths of interest for a particular DUT.

Figure 3:
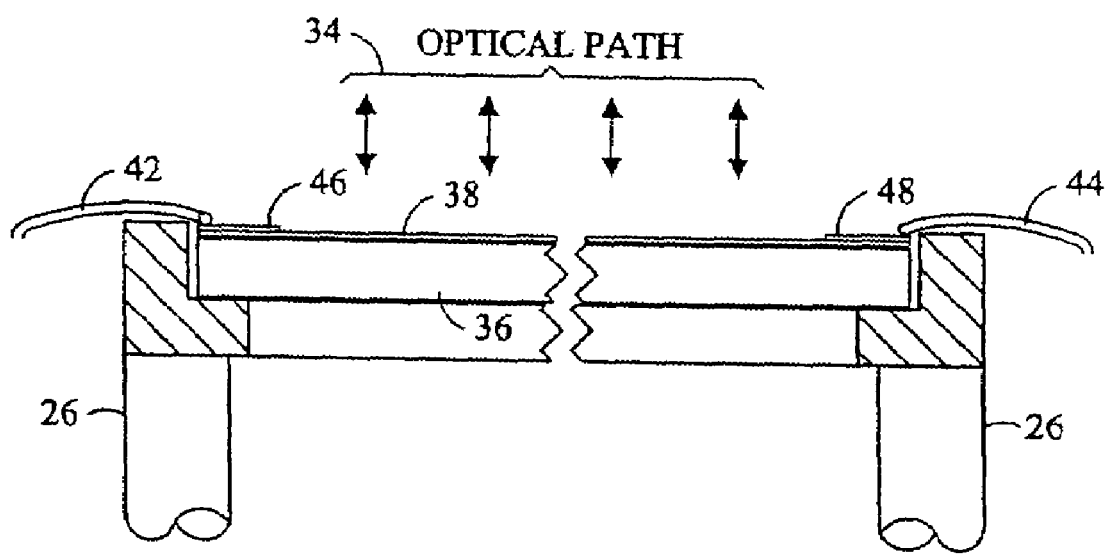
FIG. 3 is a sectional view similar to FIG. 2 illustrating a second embodiment of the thermal optical chuck having a transparent conductor deposited on the upper surface of the chuck.

The temperature of the transparent plate 36 and a DUT 30 supported on the transparent plate is modified by passing an electrical current through a transparent resistor 38 deposited over an area 40 of a surface of the plate. The transparent resistor 38 may comprise any electrical conductor which is transparent to an optical wavelength of interest and which exhibits an appropriate resistance. For example, the transparent resistor may comprise indium tin oxide (ITO), silver-zinc oxide, antimony-tin oxide or a conductive polymer, such as poly(ethylenedioxythiophene) (PEDOT) or doped polyaniline. Referring to FIG. 2, the transparent resistor 38 may be applied the lower surface of the transparent plate 36 or, as illustrated in FIG. 3, the transparent resistor may be applied to the upper surface of the transparent plate if the surface of the DUT in contact with the resistor is insulated or otherwise unaffected by an electrical current passing through the resistor.

An electrical potential is applied to the transparent resistor 38 through leads 42, 44 conductively connected, respectively, to bus bars 46, 48 arranged along opposing edges of the area 40 of the deposited transparent resistor and conductively connected to the resistor. When a potential is applied at the bus bars 46, 48, current flows, from a current source 50, through the deposited layer of conductive transparent resistor material producing heat in proportion to the resistance and square of the current, as expressed by the equation:

$$P=I^2R$$

where: P=power
I=current flowing in the resistor
R=resistance of the transparent resistor The resistance of a conductor is a function of the intrinsic resistance or resistivity of the material, the cross-sectional area of the conductor, and the length of the conductor. In a preferred embodiment, the material of the transparent resistor 38 is deposited to a uniform depth over an area 40 that is rectangular and, even more preferably, square. Parallel bus bars 42, 44 in conductive contact with the resistor material provide a current path of uniform length over the length of the bus bars, promoting uniform heating over the area 40 of the transparent resistor 38. Since many of the DUTs tested in probe stations are circular wafers, a transparent resistor deposited over a square area can provide uniform heating over the surface of the DUT while minimizing the cross-sectional area of the conductive path through resistor material of a particular depth. However, the depth of the transparent resistor material, the shape of the area 40 over which the material is deposited, and the shape and placement of the bus bars 42, 44 can be manipulated to produce uniform or non-uniform heating or a heated area of another shape, as may be required.

During testing, DUTs are commonly restrained on the top surface of a chuck by air pressure. A plurality of apertures 52 in the top surface of the transparent plate 36 of the thermal optical chuck 22 is selectively connectible to a vacuum source 54 and arranged so that when the DUT 30 placed on the surface it will block air flow to the apertures. When the blocked apertures are connected to the vacuum source 52, air pressure acts on the surface of the DUT 30 to hold the DUT in place on the surface of the chuck. Apertures 52 in the upper surface of the thermal optical chuck 22 are connected to a valve (not illustrated) that selectively connects the apertures to the vacuum source 54 by transparent piping 56, to minimize impact on the optical path 34.

Figure 4:
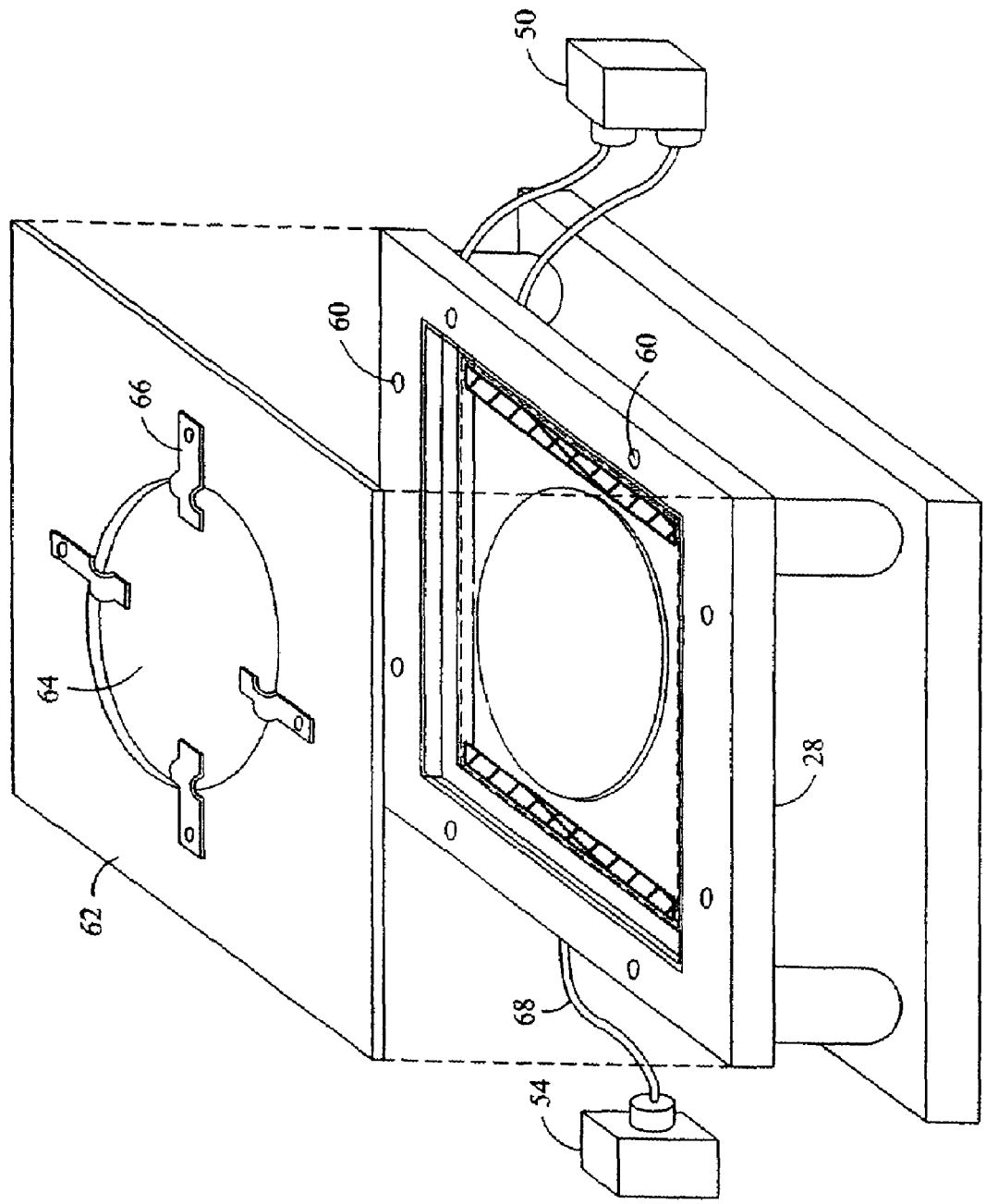
FIG. 4 is a perspective view of a thermal optical chuck including a restraining clamp for the device-under-test.

However, even transparent piping connecting a vacuum source a plurality of spaced apertures in the transparent plate 36 can interfere with optical access to the bottom of the DUT 30. Referring to FIG. 4, an alterative mechanism for securing a DUT 30 to the surface of a thermal optical chuck assembly 22 comprises a clamp plate 62 including a central aperture 64 sufficiently large to accept the DUT 30. A plurality of clips 66 are arranged around the central aperture and attached to the clamp plate 62. When the clamp plate 62 is lowered over the DUT 30, the clips 66 engage the upper surface of the DUT and the clamp plate covers a plurality of apertures 60 in the top surface of the frame 28. The apertures 60 are selectively connectible to a vacuum source 54 by piping 68. When the apertures 60 are connected to the vacuum source 54, air flow to the apertures is blocked by the clamp plate 62. Air pressure exerted on the clamp plate 62 restrains the clamp plate to the frame 28 and the clips 66 restrain the DUT to the thermal optical chuck 22. The optical path 34 is unrestricted over the entirety of the bottom surface of the DUT.

The thermal optical chuck permits a DUT supported on the surface of the chuck to be tested at a temperature other than ambient while providing optical access to the underside the DUT.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A thermal optical chuck for supporting a device under test in a probe station, said thermal optical chuck comprising:

(a) a rectangular transparent conductor having a resistance and arranged proximate a surface of said device under test;

(b) a first bus bar in conductive contact with said rectangular transparent conductor at a location nearer a first edge of said conductor than a second edge of said conductor, said first bus bar being connectible to a source of electric current; and (c) a second bus bar in conductive contact with said transparent conductor at a location nearer said second edge of said conductor than said first edge, said second bus bar being connectible to said source of electric current and spaced apart from said first bus bar.

2. The thermal optical chuck of claim 1 wherein said transparent conductor comprises indium tin oxide.

3. The thermal optical chuck of claim 1 wherein said transparent conductor comprises silver zinc oxide.

4. The thermal optical chuck of claim 1 wherein said transparent conductor comprises antimony tin oxide.

5. The thermal optical chuck of claim 1 wherein said transparent conductor comprises a conductive polymer.

6. The thermal optical chuck of claim 5 wherein said conductive polymer comprises poly(ethylenedioxythiophene).

7. The thermal optical chuck of claim 5 wherein said conductive polymer comprises polyaniline.

8. The thermal optical chuck of claim 1 wherein said rectangular transparent conductor is supported on a surface of a transparent plate, said transparent plate supporting said device under test.

9. The thermal optical chuck of claim 8 wherein said transparent plate comprises fused silica.

10. The thermal optical chuck of claim 8 wherein said transparent plate comprises quartz.

11. The thermal optical chuck of claim 8 wherein said transparent plate comprises sapphire.

12. The thermal optical chuck of claim 8 wherein said transparent plate comprises lithium niobate.

13. The thermal optical chuck of claim 8 wherein said transparent plate comprises glass.

14. The thermal optical chuck of claim 1 wherein said rectangular transparent conductor comprises a square transparent conductor.

15. The thermal optical chuck of claim 1 wherein said second bus bar includes a length arranged substantially parallel to a portion of said first bus bar.

16. The thermal optical chuck of claim 1 further comprising:
(a) a base; and
(b) a support maintaining said base and said rectangular transparent conductor in a spaced relationship.

17. The thermal optical chuck of claim 1 further comprising:

(a) a frame having portions defining a first aperture circumscribing a substantial area of said rectangular transparent conductor and a second aperture being connectible to a vacuum source; and (b) a clamp including a first surface arranged to engage a surface of a device under test and a second surface arranged to block a flow of air to said second aperture when said second aperture is connected to a vacuum source, said clamp securing a surface of said device under test proximate said rectangular transparent conductor when said first surface is in engagement with said device under test and said second surface is blocking said flow of air to said second aperture.

18. A thermal optical chuck for supporting a device under test in a probe station, said thermal optical chuck comprising:
(a) a base;
(b) a transparent plate having a first surface for supporting said device under test and an opposing second surface;
(c) a support spacing apart said base and said transparent plate;
(d) a transparent conductor having a resistance, said transparent conductor being deposited over a rectangular area of said second surface of said transparent plate, said rectangular area being defined by a first edge and a spaced apart second edge;
(e) a first bus bar in conductive contact with said transparent conductor proximate said first edge, said first bus bar being connectible to a source of electric current; and
(f) a second bus bar in conductive contact with said transparent conductor proximate said second edge, said second bus bar being connectible to said source of electric current.

19. The thermal optical chuck of claim 18 wherein said transparent plate comprises at least one of glass, sapphire, fused silica, quartz, and lithium niobate.

20. The thermal optical chuck of claim 18 wherein said transparent conductor comprises one of indium tin oxide, silver zinc oxide, antimony tin oxide, and a conductive polymer.

21. The thermal optical chuck of claim 18 further comprising:
(a) a frame adjacent to said edge of said transparent plate, said frame including a surface having portions defining an aperture, said aperture being connectible to a vacuum source; and
(b) a clamp including a first surface arranged to engage an upper surface of a device under test supported by said transparent plate and a second surface arranged to block a flow of air to said aperture when said first surface is engaged with said upper surface of said device under test and said aperture is connected to a vacuum source.

* * * * *